(12) United States Patent
Briggs et al.

(10) Patent No.: US 10,784,156 B2
(45) Date of Patent: Sep. 22, 2020

(54) SELF-ALIGNED AIRGAPS WITH CONDUCTIVE LINES AND VIAS

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, Rhinebeck, NY (US); Bartlet H. Deprospo, Goshen, NY (US); Huai Huang, Saratoga Springs, NY (US); Christopher J. Penny, Saratoga Springs, NY (US); Michael Rizzolo, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 64 days.

(21) Appl. No.: 15/827,613

(22) Filed: Nov. 30, 2017

(65) Prior Publication Data
US 2018/0082885 A1 Mar. 22, 2018

Related U.S. Application Data

(62) Division of application No. 15/196,134, filed on Jun. 29, 2016, now Pat. No. 9,899,256.

(51) Int. Cl.
*H01L 23/48* (2006.01)
*H01L 23/52* (2006.01)
(Continued)

(52) U.S. Cl.
CPC ...... *H01L 21/7682* (2013.01); *H01L 21/7684* (2013.01); *H01L 21/76802* (2013.01); *H01L 21/76829* (2013.01); *H01L 21/76834* (2013.01); *H01L 21/76877* (2013.01); *H01L 23/5222* (2013.01); *H01L 23/5226* (2013.01); *H01L 23/5329* (2013.01); *H01L 23/53295* (2013.01);
(Continued)

(58) Field of Classification Search
CPC ......... H01L 21/76802; H01L 21/76829; H01L 21/76834; H01L 21/7684; H01L 21/76877; H01L 23/5226; H01L 23/5329; H01L 23/53295
USPC ........................................................ 257/758
See application file for complete search history.

(56) References Cited

U.S. PATENT DOCUMENTS 6,071,805 A   6/2000  Liu
6,091,149 A   7/2000  Hause et al.
(Continued)

OTHER PUBLICATIONS

List of IBM Patents or Patent Applications Treated as Related; (Appendix P), Date Filed Apr. 15, 2019; 2 pages.
(Continued)

*Primary Examiner* — Kimberly N Rizkallah
*Assistant Examiner* — Dilinh P Nguyen
(74) *Attorney, Agent, or Firm* — Cantor Colburn LLP; Vazken Alexanian (57) ABSTRACT

A conductive line structure comprises a first conductive line arranged in a first dielectric layer, a second conductive line arranged in the first dielectric layer, a cap layer arranged on the first conductive line and the second conductive line, and an airgap arranged between the first conductive line and the second conductive line, the airgap defined by the first dielectric layer and the cap layer.

9 Claims, 12 Drawing Sheets

(51) Int. Cl.
*H01L 21/768* (2006.01)
*H01L 23/522* (2006.01)
*H01L 23/532* (2006.01)

(52) U.S. Cl.
CPC .. *H01L 21/76826* (2013.01); *H01L 21/76832* (2013.01); *H01L 21/76883* (2013.01); *H01L 21/76897* (2013.01)

(56) References Cited

U.S. PATENT DOCUMENTS

| | | | |
|---|---|---|---|
| 6,261,942 B1 | 7/2001 | Zhou et al. | |
| 7,671,442 B2 | 3/2010 | Anderson et al. | |
| 7,754,601 B2 | 7/2010 | Chen et al. | |
| 8,030,202 B1 | 10/2011 | Horak et al. | |
| 8,575,000 B2 | 11/2013 | Purayath et al. | |
| 8,847,396 B2 | 9/2014 | Huang et al. | |
| 8,900,988 B2 * | 12/2014 | Lin | H01L 21/31127 257/E21.581 |
| 2012/0199938 A1 * | 8/2012 | Hwang | H01L 21/7682 257/506 |
| 2016/0240428 A1 * | 8/2016 | Tung | H01L 21/7682 |
| 2016/0307793 A1 * | 10/2016 | Huang | H01L 21/76879 |
| 2018/0005868 A1 | 1/2018 | Briggs et al. | |

OTHER PUBLICATIONS

Benjamin D. Briggs et al., "Self-Aligned Airgaps With Conductive Lines and Vias", U.S. Appl. No. 15/196,134, filed Jun. 29, 2016.
List of IBM Patents or Patent Applications Treated as Related; (Appendix P), Filed Nov. 30, 2017; 2 pages.

* cited by examiner

SELF-ALIGNED AIRGAPS WITH CONDUCTIVE LINES AND VIAS

DOMESTIC PRIORITY

This application is a divisional of and claims priority from U.S. patent application Ser. No. 15/196,134, filed on Jun. 29, 2016, entitled "SELF-ALIGNED AIRGAPS WITH CONDUCTIVE LINES AND VIAS," the content of which are incorporated herein by reference in its entirety.

BACKGROUND

The present invention generally relates to complimentary metal-oxide semiconductors (CMOS) and metal-oxide-semiconductor field-effect transistors (MOSFET), and more specifically, to forming conductive lines with lower capacitance in integrated circuits.

The MOSFET is a transistor used for switching electronic signals. The MOSFET has a source, a drain, and gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

As CMOS scales to smaller dimensions, nanowire devices provide advantages. A nanowire is often suspended above the substrate by source/drain regions or the gate stack. Because the nanowire is suspended, the channel region of a nanowire device has 360 degrees of exposed area. The gate stack may be formed around the channel region of the nanowire to form a gate-all-around-device. The nanowire may provide even more surface area and greater channel length than a finFET device or planar FET device in a given region of a substrate. Nanowire FETs may be formed from stacked nanowires providing even greater layout density. Stacked nanowires provide, for example, increased drive current within a given layout area.

Gate spacers form an insulating film along gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming an airgap between conductive lines comprises forming a first conductive line in a first cavity in a first dielectric layer and forming a second conductive line in a second cavity in the first dielectric layer. A portion of the first conductive line and a portion of the second conductive line are removed to expose a portion of the first cavity and a portion of the second cavity. A cap layer is deposited over the first dielectric layer, the first conductive line, and the second conductive line. A second dielectric layer is formed in the first cavity and the second cavity. A planarization layer is formed over the cap layer and the second dielectric layer. A portion of the planarization layer is removed to expose a portion of the cap layer, and a portion of the cap layer is removed to expose a portion of the first dielectric layer. The exposed portion of the first dielectric layer is removed to form a third cavity. A third dielectric layer is deposited over exposed portions of the cap layer, the second dielectric layer and the third cavity.

According to another embodiment of the present invention, a method for forming an airgap between conductive lines comprises forming a first conductive line in a first cavity in a first dielectric layer and forming a second conductive line in a second cavity in the first dielectric layer. A portion of the first conductive line and a portion of the second conductive line are removed to expose a portion of the first cavity and a portion of the second cavity. A cap layer is deposited over the first dielectric layer, the first conductive line, and the second conductive line. A second dielectric layer is formed in the first cavity and the second cavity. A sacrificial cap is formed on the cap layer and the second dielectric layer, and a hardmask is formed on the sacrificial cap. A planarization layer is formed over the hardmask. A portion of the planarization layer and the hardmask are removed to expose a portion of the sacrificial cap. The planarization layer is removed to expose the hardmask. Exposed portions of the sacrificial cap are removed to expose portions of the second dielectric layer and the cap layer. A portion of the cap layer is removed to expose a portion of the first dielectric layer. The exposed portion of the first dielectric layer is removed to form a third cavity. A third dielectric layer is deposited over exposed portions of the cap layer, the second dielectric layer and the third cavity.

According to yet another embodiment of the present invention, a conductive line structure comprises a first conductive line arranged in a first dielectric layer, a second conductive line arranged in the first dielectric layer, a cap layer arranged on the first conductive line and the second conductive line, and an airgap arranged between the first conductive line and the second conductive line. The airgap is defined by the first dielectric layer and the cap layer.

BRIEF DESCRIPTION OF THE DRAWINGS

FIGS. 1A-12 illustrate an exemplary method and resultant structure having an airgap formed between conductive lines.

FIGS. 13-20 illustrate another exemplary method for forming an airgap between conductive lines.

DETAILED DESCRIPTION

Following the formation of semiconductor devices on a wafer, an insulator layer is often deposited over the semiconductor devices, and conductive lines are formed in the insulator layer by removing portions of the insulator layer to form trenches. The trenches are filled with a conductive material to form conductive lines.

The conductive lines are typically formed in a dielectric material that when arranged between conductive lines results in an undesirable capacitive property. The formation of an airgap or a void filled with air between conductive lines tends to reduce the capacitance of the conductive line arrangement.

One challenge in forming airgaps between conductive lines is forming an airgap that has sufficient air volume. In fabrication, conductive lines are often formed with a liner layer deposited into a cavity prior to depositing the conductive material. When the void for the airgap is formed prior to depositing the liner layer, the liner layer is often deposited into the airgap void as well as the cavity for the conductive line. The liner layer reduces the volume of the airgap void and reduces the effectiveness of the airgap in reducing the capacitance of the conductive lines. In other instances, following the formation of the conductive lines and the airgap, the airgap may become lined with an insulator layer or a dielectric layer during subsequent fabrication processes.

The methods and resultant structures described herein provide for forming an airgap between conductive lines with a volume that is not substantially reduced by the deposition of subsequent material layers.

FIGS. 1A-12 illustrate an exemplary method and resultant structure having an airgap formed between conductive lines.

Figure 1A:
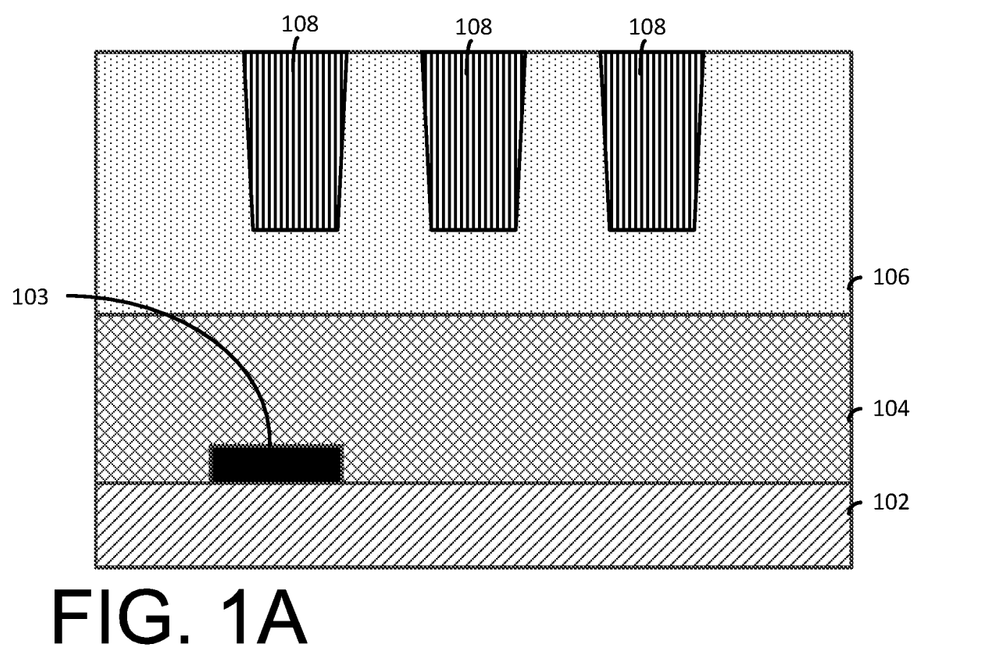
FIG. 1A illustrates a cut-away view along the line A-A (of FIG. 1B) of a substrate and a semiconductor device arranged on the substrate.

FIG. 1A illustrates a cut-away view along the line A-A (of FIG. 1B) of a substrate 102 and a semiconductor device 103 arranged on the substrate. The semiconductor device 103 may include any type of logic device or electronic component.

Non-limiting examples of suitable materials for the substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials may include at least one "III element," such as aluminum (Al), boron (B), gallium (Ga), indium (In), and at least one "V element," such as nitrogen (N), phosphorous (P), arsenic (As), antimony (Sb).

An insulator layer 104 is arranged on the semiconductor device 103 and the substrate 102. An inter-level dielectric layer 106 is arranged on the insulator layer 104. The inter-level dielectric layer 106 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 106 is deposited by a deposition process, including, but not limited to CVD, PVD, plasma enhanced CVD, atomic layer deposition (ALD), evaporation, chemical solution deposition, or like processes. Following the deposition of the inter-level dielectric layer 106, a planarization process such as, for example, chemical mechanical polishing is performed.

Figure 1B:
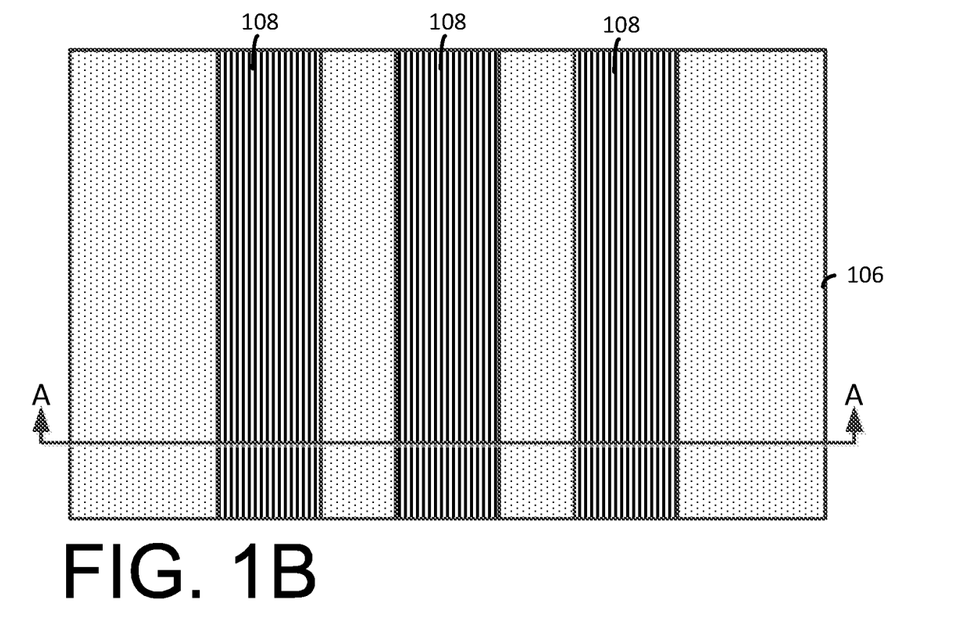
FIG. 1B illustrates a top view of the conductive lines.

Conductive lines 108 are formed in the inter-level dielectric layer 106. The conductive lines 108 are formed by, for example, a lithographic patterning and etching process that forms cavities in the inter-level dielectric layer 106. Once the cavities are formed, a liner layer may be deposited in the cavities. A conductive material, such as, for example, copper, gold, silver, or tungsten is deposited using a spin on or atomic layer deposition process is deposited in the cavities. A planarization process such as, for example, chemical mechanical polishing is performed to remove overburdened conductive material and define the conductive lines 108. FIG. 1B illustrates a top view of the conductive lines 108.

Figure 2:
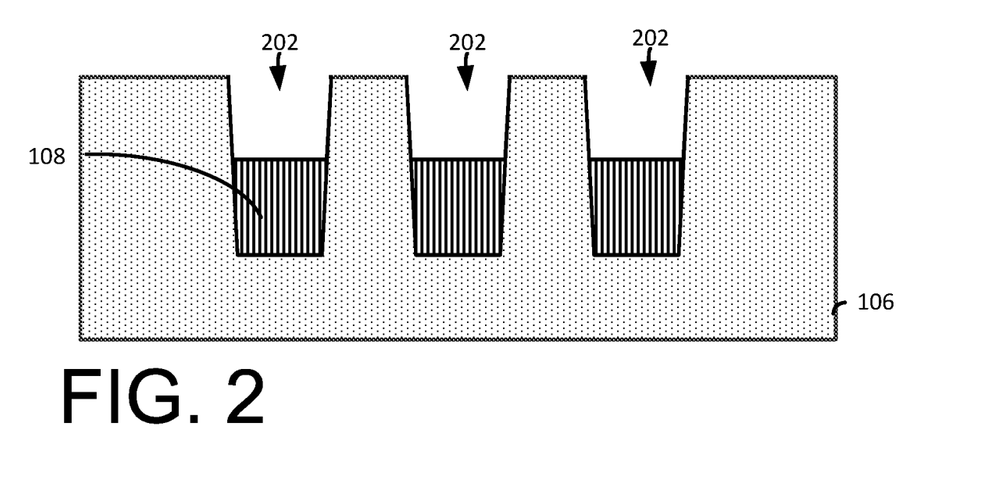
FIG. 2 illustrates a cut-away view following an etching process that removes portions of the conductive lines to form cavities.

FIG. 2 illustrates a cut-away view following an etching process that removes portions of the conductive lines 108 to form cavities 202. The etching process may include, for example a selective anisotropic or wet etch process. The substrate 102, the semiconductor device 103, and the insulator layer 104 have been removed from FIG. 2 and subsequent figures for clarity.

Figure 3:
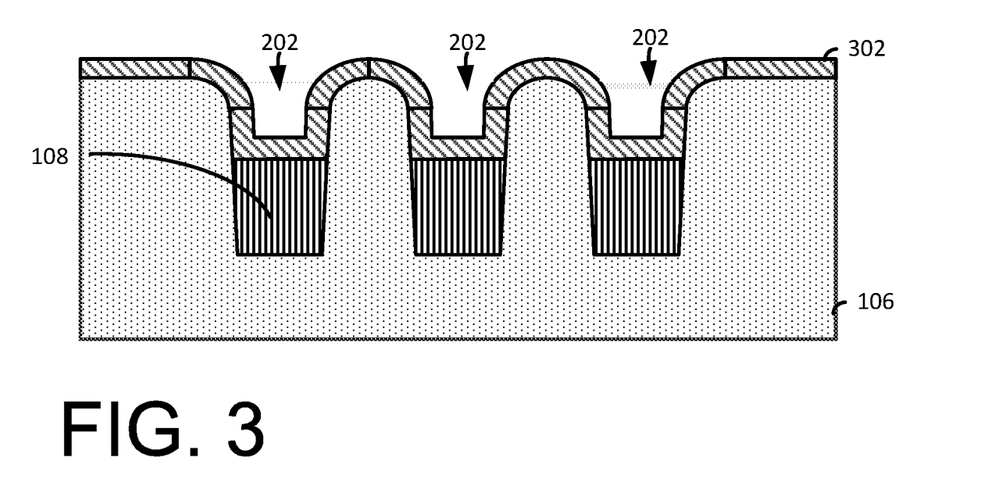
FIG. 3 illustrates a cut-away view following the formation of a cap layer over exposed portions of the inter-level dielectric layer and the conductive lines.

FIG. 3 illustrates a cut-away view following the formation of a cap layer 302 over exposed portions of the inter-level dielectric layer 106 and the conductive lines 108. The cap layer 302 may include, for example, silicon oxide, silicon nitride (SiN), SiOCN, SiBCN or any suitable combination of those. The cap layer 302 may be deposited using a deposition process, including, but not limited to, PVD, CVD, PECVD, or any combination thereof.

Figure 4:
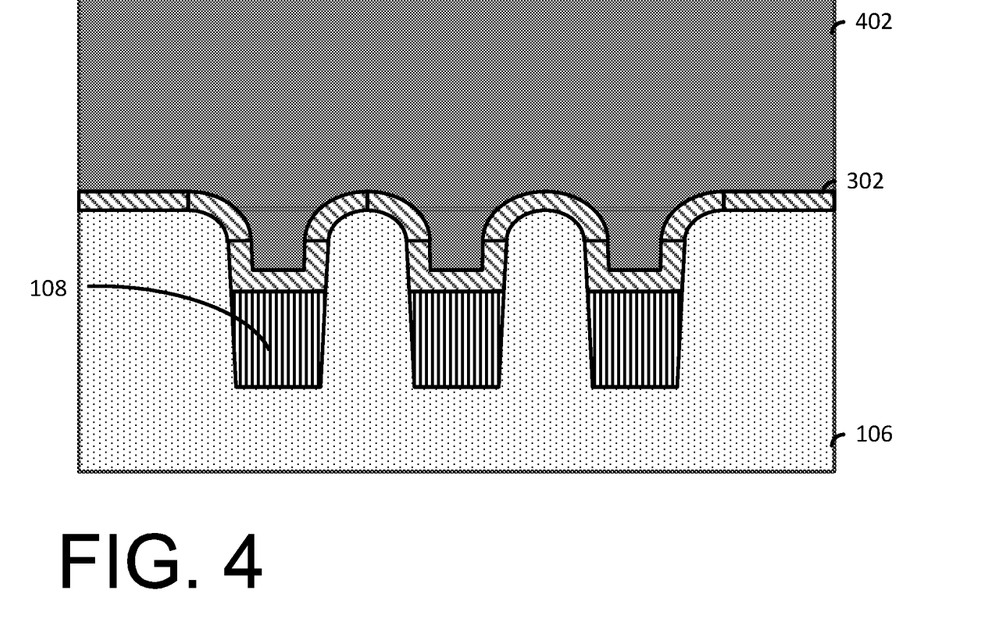
FIG. 4 illustrates a cut-away view following the formation of a second inter-level dielectric layer over the cap layer.

FIG. 4 illustrates a cut-away view following the formation of a second inter-level dielectric layer 402 over the cap layer 302. The second inter-level dielectric layer 402 fills the cavities 202 (of FIG. 3). The second inter-level dielectric layer 402 may include, for example, flowable oxide or a lowK dielectric material. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 5:
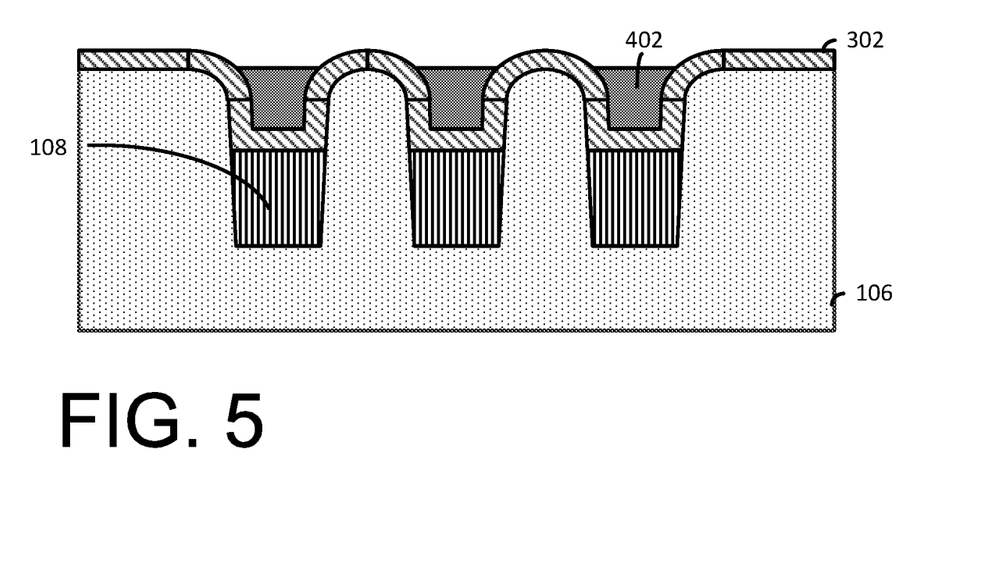
FIG. 5 illustrates a cut-away view following an etching process that removes exposed portions of the second inter-level dielectric layer to expose the cap layer.

FIG. 5 illustrates a cut-away view following an etching process that removes exposed portions of the second inter-level dielectric layer 402 to expose the cap layer 302.

Figure 6:
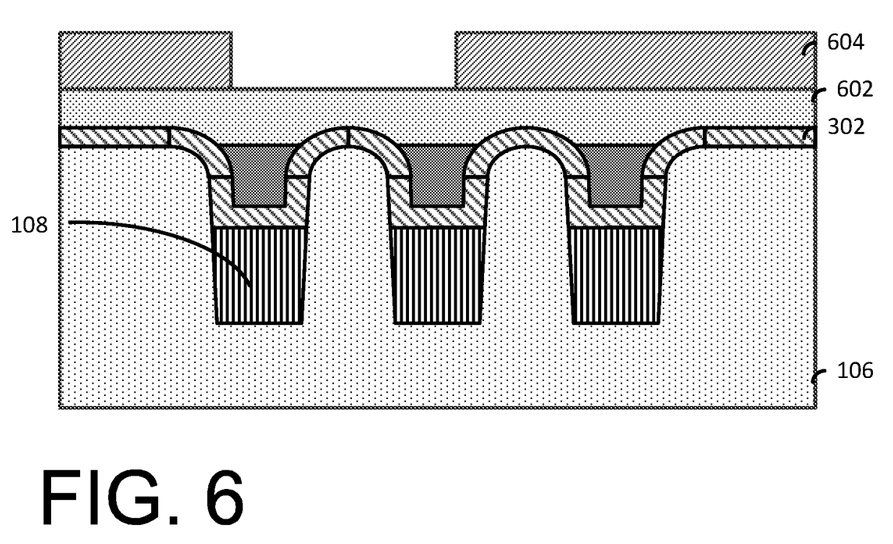
FIG. 6 illustrates a cut-away view of the resultant structure following the depositing of a planarization layer over the exposed portions of the cap layer and the second inter-level dielectric layer.

FIG. 6 illustrates a cut-away view of the resultant structure following the depositing of a planarization layer 602 over the exposed portions of the cap layer 302 and the second inter-level dielectric layer 402. The planarization layer 602 may include, for example, an organic planarizing material.

A resist mask 604 is patterned on the planarization layer 602. Suitable resist masks include photoresists, electron-beam resists, ion-beam resists, X-ray resists, and etch resists. The resist may include a polymeric spin on material or a polymeric material.

Figure 7:
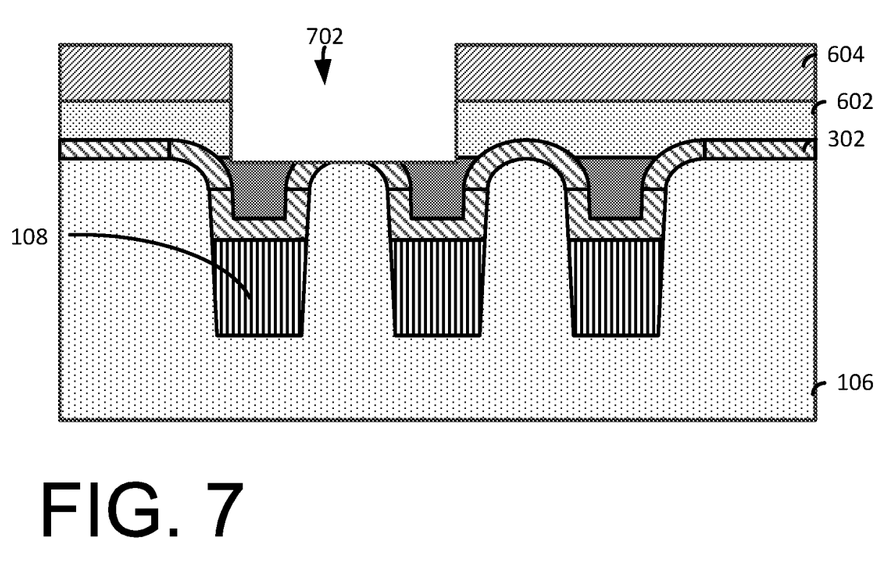
FIG. 7 illustrates a cut-away view following an anisotropic etching process that forms a cavity.

FIG. 7 illustrates a cut-away view following an anisotropic etching process that forms a cavity 702. The cavity 702 may be formed by, for example, a reactive ion etching that removes exposed portions of the cap layer 302 to expose a region of the inter-level dielectric layer 106.

Figure 8:
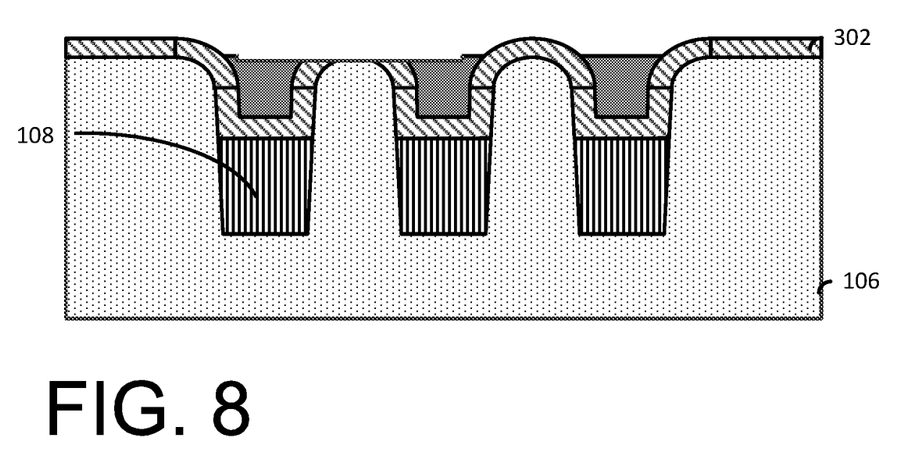
FIG. 8 illustrates a cut-away view following the removal of the resist mask and the planarization layer (of FIG. 7).

FIG. 8 illustrates a cut-away view following the removal of the resist mask 602 and the planarization layer 604 (of FIG. 7). The resist mask 602 and the planarization layer 604 may be removed by, for example, an ashing process. The ashing process may be used to remove a photoresist material, amorphous carbon, or organic planarization (OPL) layer. Ashing is performed using a suitable reaction gas, for example, $O_2$, $N_2$, $H2/N2$, $O_3$, $CF_4$, or any combination thereof.

Figure 9:
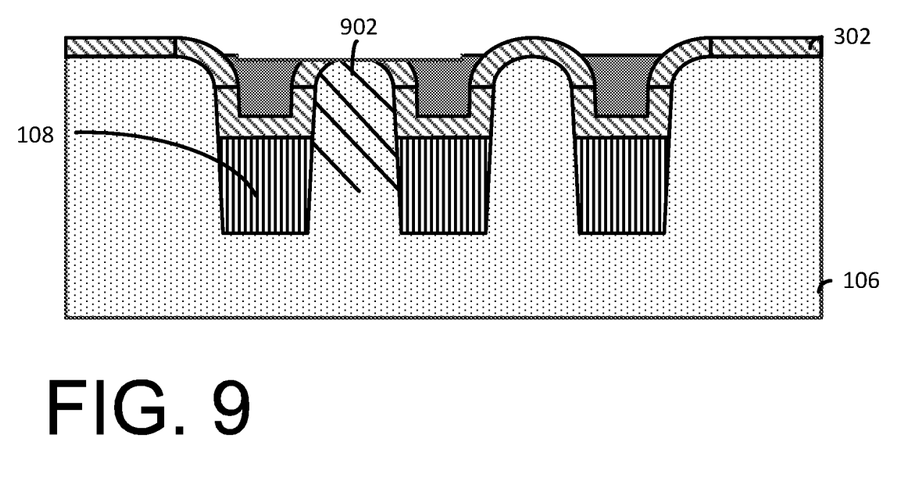
FIG. 9 illustrates a cut-away view following a process that damages the exposed portion of the inter-level dielectric layer to form a damaged region.

FIG. 9 illustrates a cut-away view following a process that damages the exposed portion of the inter-level dielectric layer 106 to form a damaged region 902. The damaged region 902 may be formed by, for example, a plasma process such as, an oxygen plasma process, a hydrogen plasma process, or a nitrogen plasma process. The plasma process does not damage portions of the inter-level dielectric layer 106 or the conductive lines 108 that are protected by the cap layer 302 however, because the cap layer 302 is opened above the damaged region 902, the damaged region 902 is formed during the process. The damaged region 902 is formed by the removal of carbon from the inter-level dielectric layer 106 using the plasma process. The plasma process converts the dielectric material to a $SiO_x$ type material that is readily etched using, for example, hydrofluoric acid. The timing and the power used in the plasma process determine the depth of the damaged region 902.

Figure 10A:
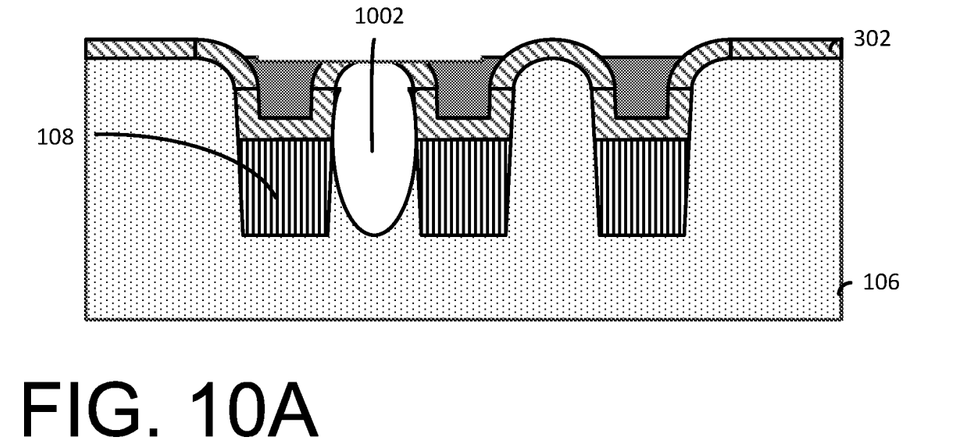
FIG. 10A illustrates a cut-away view along the line A-A (of FIG. 10B) following an etching process that selectively removes the damaged region (of FIG. 9) to form a cavity.
Figure 10B:
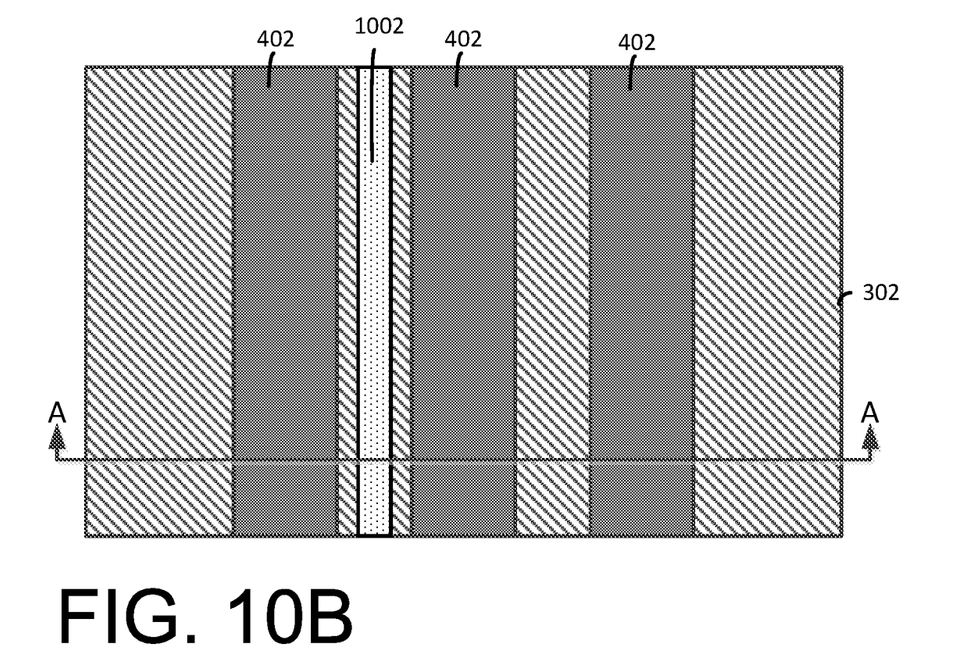
FIG. 10B illustrates a top view of the cavity.

FIG. 10A illustrates a cut-away view along the line A-A (of FIG. 10B) following an etching process that selectively removes the damaged region 902 (of FIG. 9) to form a cavity 1002. The cavity 1002 is removed using an etching process such as a wet etch process. The cavity 1002 is defined by the inter-level dielectric layer 106 and the cap layer 302. In some embodiments, the cavity 1002 may be further defined by the conductive lines 108. The cavity 1002 is arranged between conductive lines 108 and will provide an airgap to reduce the capacitive properties of the conductive lines 108. FIG. 10B illustrates a top view of the cavity 1002.

Figure 11:
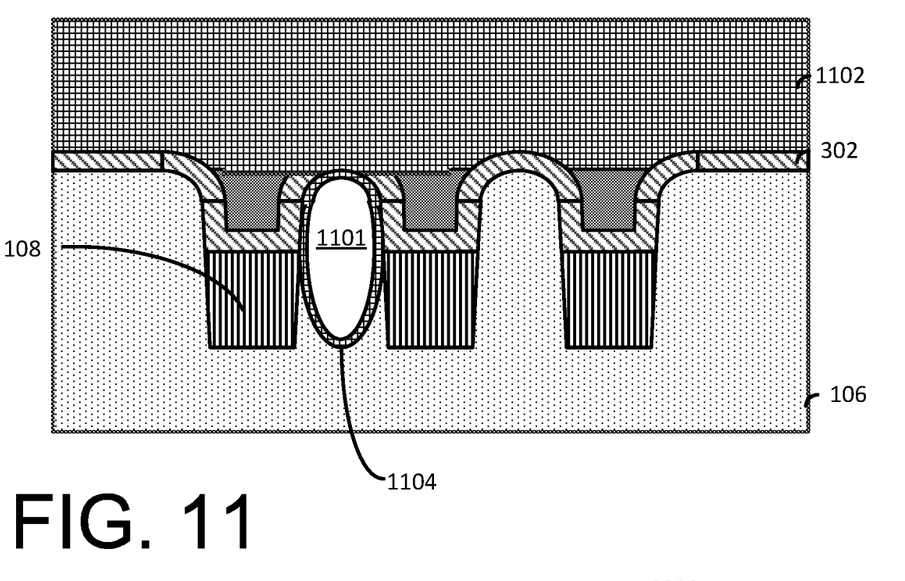
FIG. 11 illustrates a cut-away view following the deposition of a third inter-level dielectric layer over the cap layer, the second inter-level dielectric layer, and the cavity (of FIG. 10A).

FIG. 11 illustrates a cut-away view following the deposition of a third inter-level dielectric layer 1102 over the cap layer 302, the second inter-level dielectric layer 402, and the cavity 1002 (of FIG. 10A). The deposition of the third inter-level dielectric layer 1102 may deposit some dielectric material in the cavity 1002 that results in a relatively thin layer of dielectric material 1104. The resultant airgap 1101 is formed when the third inter-level dielectric layer 1102 closes the opening 1003 of the cavity 1002 (of FIG. 10A). Because the opening 1003 is relatively small, the deposition of the third inter-level dielectric layer 1102 closes the opening 1003 quickly such that the layer of dielectric material 1104 in the airgap 1101 remains relatively thin. Thus, the volume of the airgap 1101 is substantially maintained.

Figure 12:
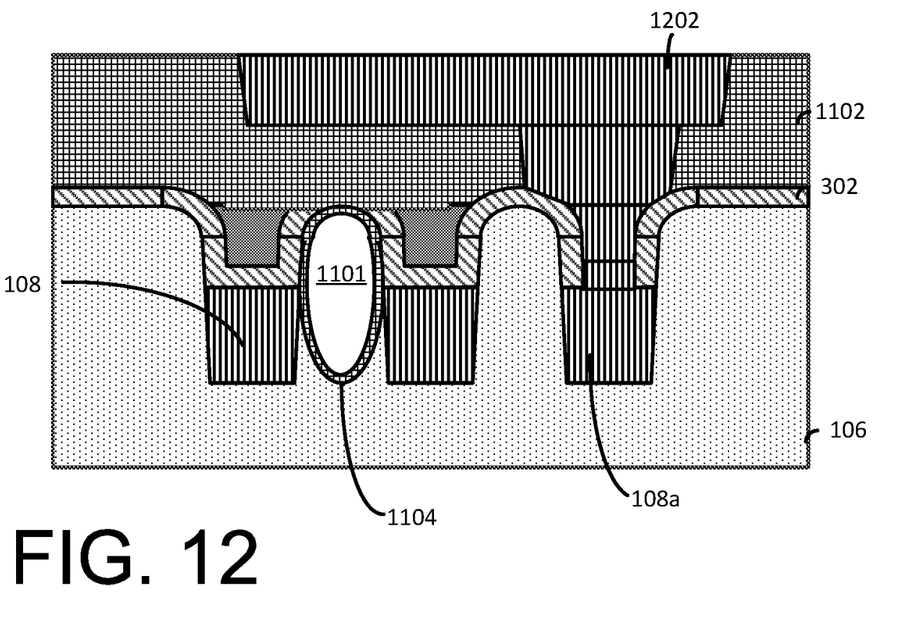
FIG. 12 illustrates a cut-away view following the formation of a conductive via 1202 that forms an electrical connection to the conductive line.

FIG. 12 illustrates a cut-away view following the formation of a conductive via 1202 that forms an electrical connection to the conductive line 108a. The conductive via 1202 may be formed by, for example, a self-aligned patterning and etching process that removes portions of the third inter-level dielectric layer 1102 to form a cavity that exposes portions of the conductive line 108a.

FIGS. 13-20 illustrate another exemplary method for forming an airgap between conductive lines.

Figure 13:
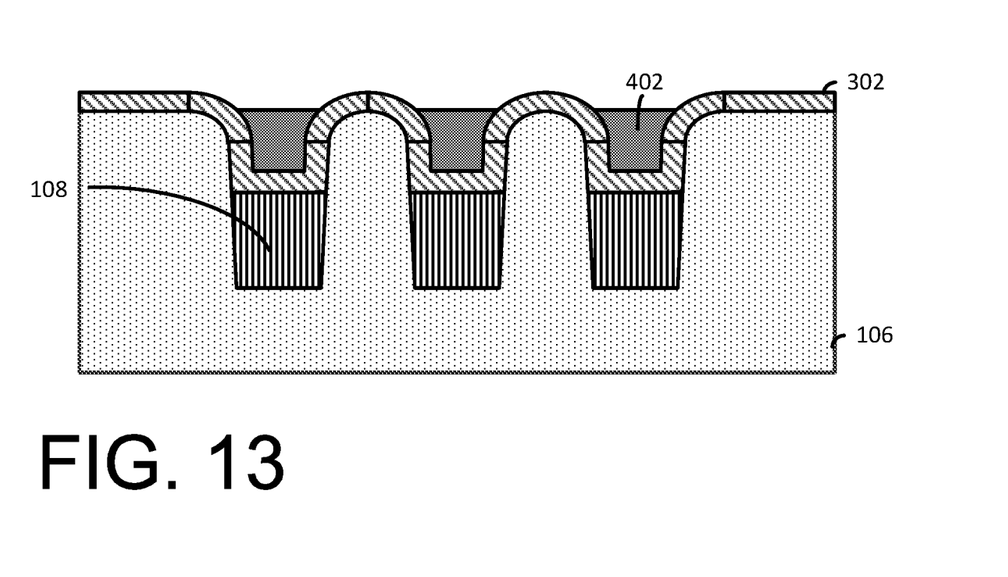
FIG. 13 illustrates a cut-away view following an etching process that removes exposed portions of the second inter-level dielectric layer to expose the cap layer.

FIG. 13 illustrates a cut-away view that is similar to FIG. 5 described above. The illustrated exemplary method may follow a similar process as described above in FIGS. 1A-5.

Figure 14:
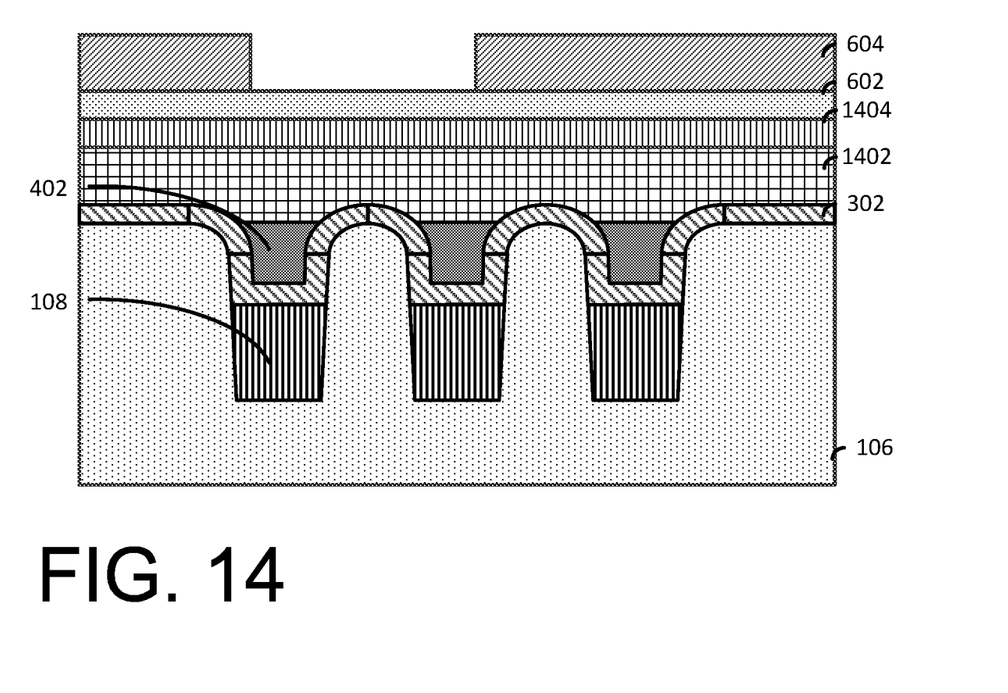
FIG. 14 illustrates a cut-away view following the deposition of a sacrificial cap layer over exposed portions of the cap layer and the second inter-level dielectric layer.

FIG. 14 illustrates a cut-away view following the deposition of a sacrificial cap layer 1402 over exposed portions of the cap layer 302 and the second inter-level dielectric layer 402. The sacrificial cap layer 1402 may include, for example, a nitride material such as, silicon nitride (SiN), SiOCN, SiBCN or any suitable combination of those. The sacrificial cap layer 1402 may be deposited using a deposition process, including, but not limited to, PVD, CVD, PECVD, or any combination thereof.

Following the formation of the sacrificial cap layer 1402, a hardmask 1404 is formed on the sacrificial cap layer 1402. The hardmask 1404 may include, for example, an oxide material. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Following the formation of the hardmask 1404, a planarizing layer 602 is deposited on the hardmask 1404 in a similar manner as described above. A resist 604 is patterned on the planarization layer 602.

Figure 15:
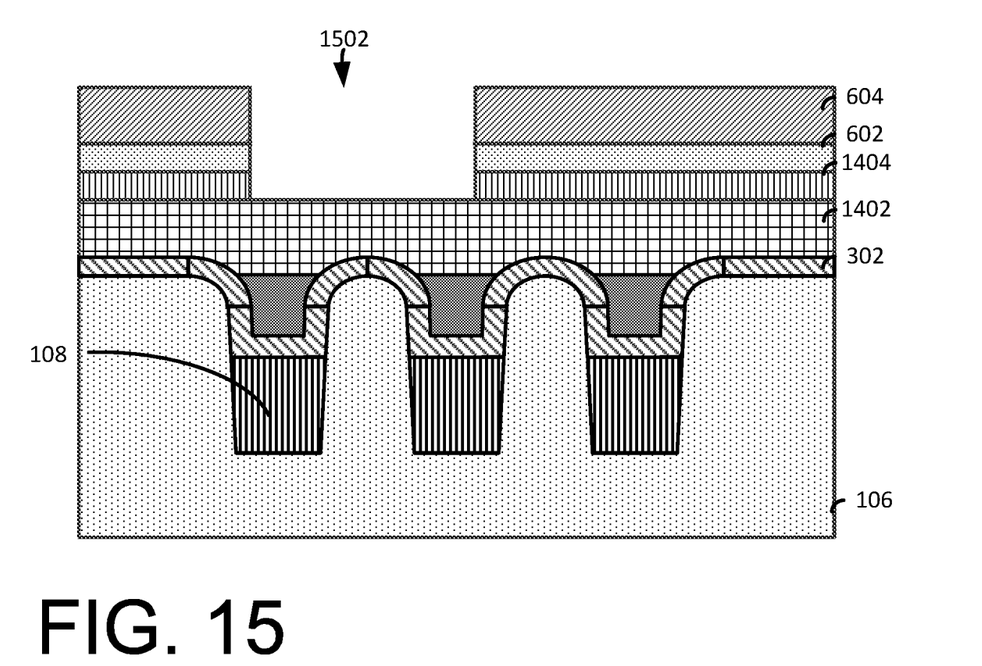
FIG. 15 illustrates a cut-away view of the resultant structure following a selective etching process that removes exposed portions of the planarization layer and the hardmask to form a cavity.

FIG. 15 illustrates a cut-away view of the resultant structure following a selective etching process that removes exposed portions of the planarization layer 602 and the hardmask 1404 to form a cavity 1502 that exposes a portion of the sacrificial cap layer 1402.

Figure 16:
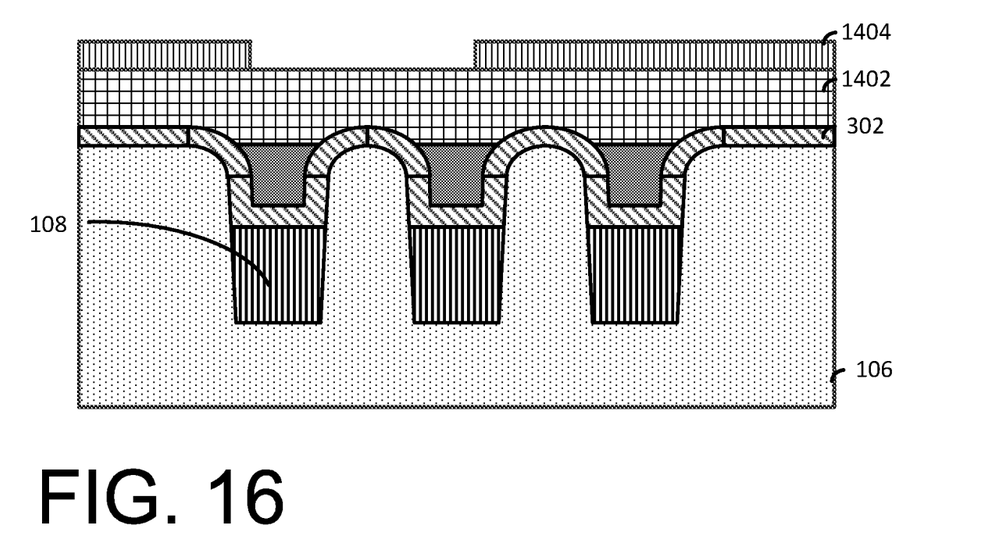
FIG. 16 illustrates a cut-away view following the removal of the resist and the planarization layer using a suitable process such as, for example, ashing that exposes the hardmask.

FIG. 16 illustrates a cut-away view following the removal of the resist 604 and the planarization layer 602 using a suitable process such as, for example, ashing that exposes the hardmask 1404.

Figure 17:
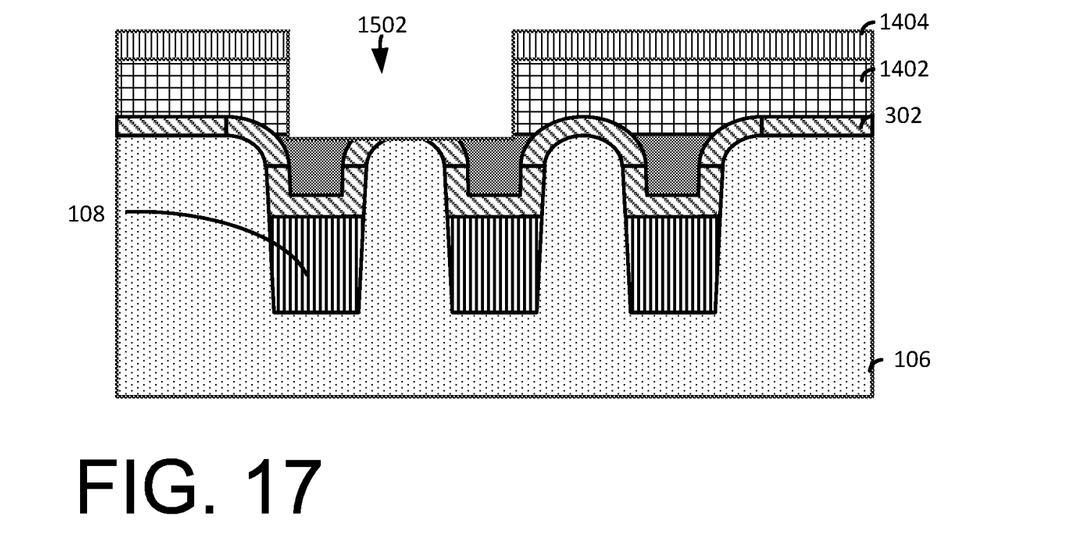
FIG. 17 illustrates a cut-away view following a selective etching process that removes exposed portions of the sacrificial cap layer and the cap layer to increase the depth of the cavity, and expose a portion of the inter-level dielectric layer.

FIG. 17 illustrates a cut-away view following a selective etching process that removes exposed portions of the sacrificial cap layer 1402 and the cap layer 302 to increase the depth of the cavity 1502, and expose a portion of the inter-level dielectric layer 106.

Figure 18:
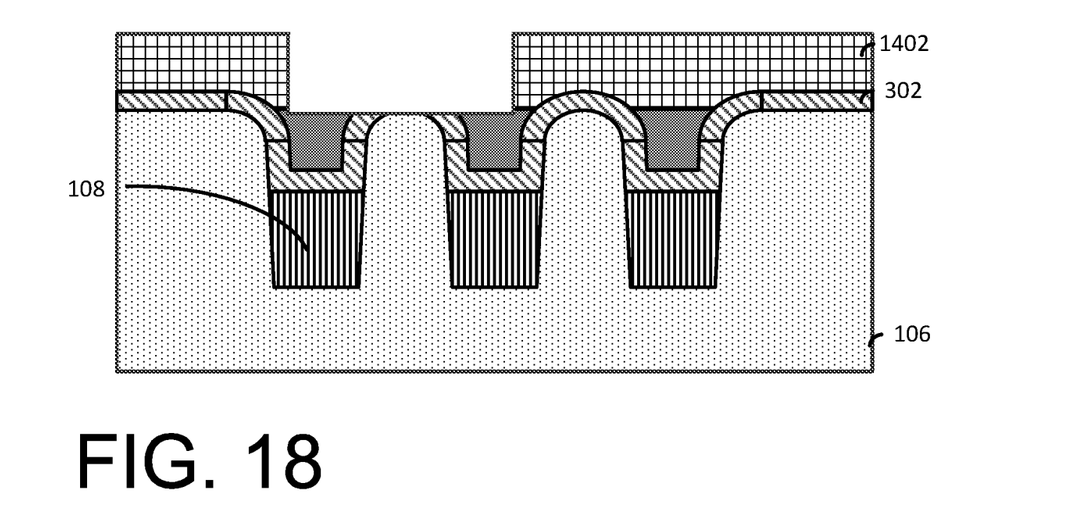
FIG. 18 illustrates a cut-away view following the removal of the hardmask (of FIG. 17).

FIG. 18 illustrates a cut-away view following the removal of the hardmask 1404 (of FIG. 17).

Figure 19:
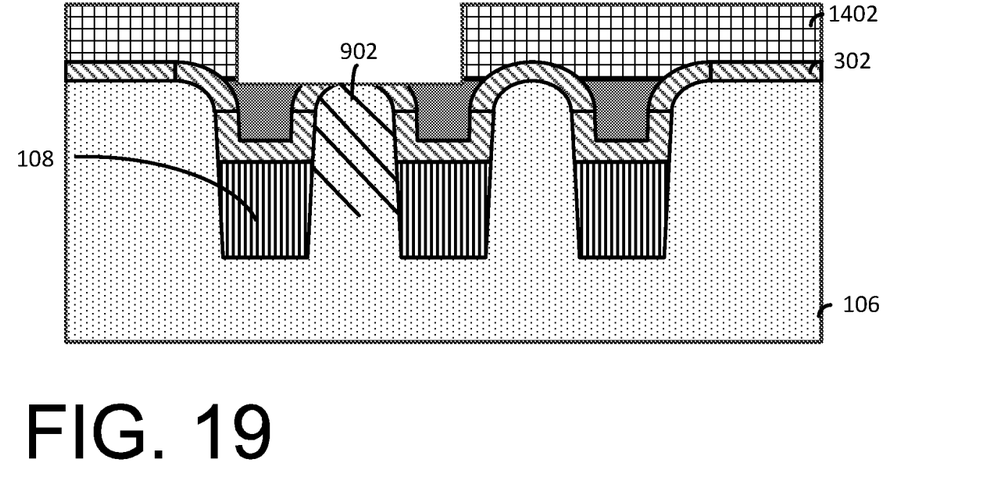
FIG. 19 illustrates a cut-away view following a damaging process that forms the damaged region in the inter-level dielectric layer.

FIG. 19 illustrates a cut-away view following a damaging process that forms the damaged region 902 in the inter-level dielectric layer 106. The damaged region 902 in the illustrated exemplary embodiment is formed using a similar process as described above.

Figure 20:
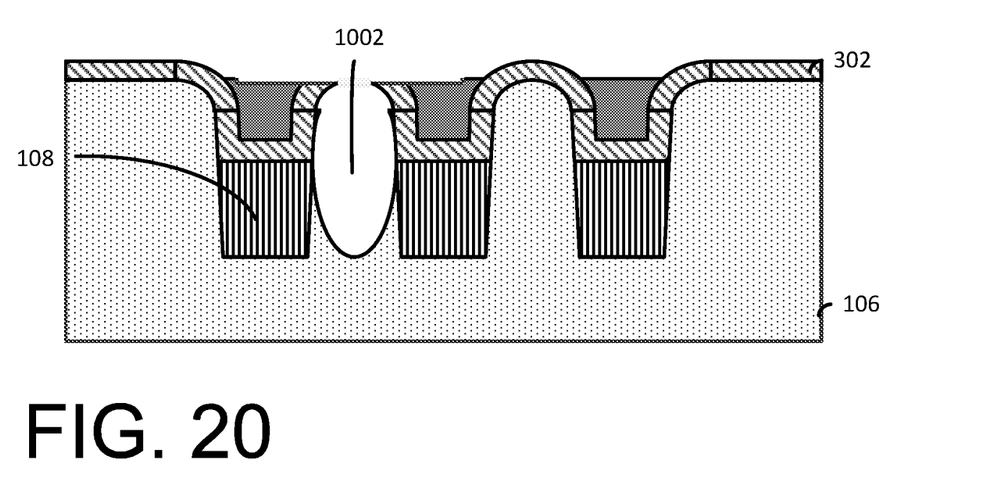
FIG. 20 illustrates a cut-away view following the removal of the exposed damaged region (of FIG. 19).

FIG. 20 illustrates a cut-away view following the removal of the exposed damaged region 902 (of FIG. 19). The exposed damaged region 902 is removed using, for example, a wet etching process that forms the cavity 1002 in a similar manner as described above.

Figure 21:
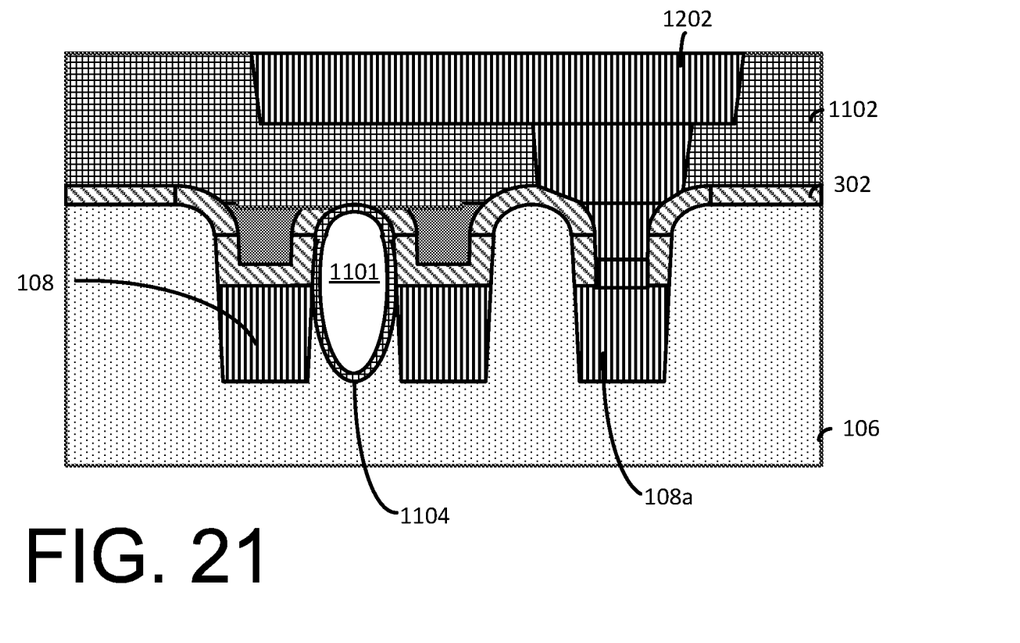
FIG. 21 illustrates a cut-away view of the resultant structure following the formation of the airgap.

FIG. 21 illustrates a cut-away view of the resultant structure following the formation of the airgap 1101. The third inter-level dielectric layer 1102 is formed over the cap layer 302, and a conductive via 1202 is formed using similar processes as described above.

The methods and resultant structures described herein provide for the formation of an airgap between conductive lines that has a sufficient volume of air to reduce the capacitance between the conductive lines. The process for forming the airgap provides for a cap layer that protects the conductive lines and the underlying inter-level dielectric layer while a portion of the inter-level dielectric layer is damaged prior to removal. The process is substantially self-aligned and provides for the formation of conductive vias using a self-aligned process.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising an airgap between conductive lines comprising:
   a first conductive line in a first cavity in a first dielectric layer and a second conductive line in a second cavity in the first dielectric layer;
   a portion of the first cavity and a portion of the second cavity exposed through a gap in the first conductive line and a gap in the second conductive line;
   a cap layer over the first dielectric layer, the first conductive line, and the second conductive line;
   a second dielectric layer in the first cavity and the second cavity;
   a planarization layer over the cap layer and the second dielectric layer;
   a gap in the planarization layer that exposes a portion of the cap layer;
   a portion of the first dielectric layer exposed through a gap in the cap layer;
   a third cavity; and
   a third dielectric layer over exposed portions of the cap layer, the second dielectric layer and the third cavity.

2. The structure of claim 1, wherein the airgap has an upper portion that is defined by the cap layer and a second dielectric layer and a lower portion that is defined by the first dielectric layer.

3. The structure of claim 1, wherein the second dielectric layer is arranged over the cap layer, and wherein the cap layer is exposed via open sections formed by removed portions of the second dielectric layer.

4. The structure of claim 1, wherein the cap layer is arranged between the first conductive line and the second conductive line, and the planarization layer has open sections exposing a portion of the cap layer.

5. The structure of claim 1, wherein the third cavity is sealed by the third dielectric layer.

6. The structure of claim 1, further comprising, a conductive via in the third dielectric layer that contacts the second conductive line.

7. The structure of claim 1, wherein the third cavity includes:
- a damaged region formed from an exposed portion of the first dielectric layer.

8. The structure of claim 7, wherein the damaged region is formed by a plasma process.

9. The structure of claim 1, wherein the first conductive line in the dielectric layer includes:
- a first cavity in the dielectric layer; and
- a conductive material in the first cavity; wherein the conductive material and the dielectric layer are planarized.

* * * * *